(12) United States Patent
Mantese et al.

(10) Patent No.: US 10,091,562 B2
(45) Date of Patent: Oct. 2, 2018

(54) ELECTROMAGNETIC COMMUNICATION FROM WAVEGUIDE CONFINEMENT

(71) Applicant: United Technologies Corporation, Farmington, CT (US)

(72) Inventors: Joseph V. Mantese, Ellington, CT (US); Kurt J. Sobanski, Glastonbury, CT (US); Brian L. McCabe, Orange, CT (US); Joseph Zacchio, Wethersfield, CT (US)

(73) Assignee: UNITED TECHNOLOGIES CORPORATION, Farmington, CT (US)

( * ) Notice: Subject to any disclaimer, the term of this patent is extended or adjusted under 35 U.S.C. 154(b) by 0 days.

(21) Appl. No.: 15/255,195

(22) Filed: Sep. 2, 2016

(65) Prior Publication Data

US 2016/0369704 A1    Dec. 22, 2016

Related U.S. Application Data

(63) Continuation-in-part of application No. 15/114,234, filed as application No. PCT/US2015/016761 on Feb. 20, 2015.

(Continued)

(51) Int. Cl.
*H04B 17/00* (2015.01)
*H04Q 1/02* (2006.01)
(Continued)

(52) U.S. Cl.
CPC .......... *H04Q 1/116* (2013.01); *F01D 21/003* (2013.01); *F02C 3/04* (2013.01); *F02C 9/00* (2013.01);
(Continued)

(58) Field of Classification Search
CPC ... H04Q 1/116; F02C 3/04; F02C 9/00; F02K 3/04; H04B 1/3822; H04B 15/025; F05D 2220/32; F05D 2260/80; H04W 84/18
(Continued)

(56) References Cited

U.S. PATENT DOCUMENTS 7,464,603 B2   12/2008 Bauer et al.
8,111,161 B2    2/2012 Lee
(Continued)

FOREIGN PATENT DOCUMENTS

CN   102169104 A    8/2011
CN   102735326 A   10/2012
(Continued)

OTHER PUBLICATIONS

EP Application No. 17188879.5 EP Search Report dated Jan. 18, 2018, 9 pages.
(Continued)

*Primary Examiner* — Lee Nguyen
(74) *Attorney, Agent, or Firm* — Cantor Colburn LLP (57) ABSTRACT

A system of a machine includes a network of a plurality of sensing/control/identification devices distributed throughout the machine. Each of the sensing/control/identification devices is associated with at least one sub-system component of the machine and operable to communicate through a plurality of electromagnetic signals. Shielding surrounds at least one of the sensing/control/identification devices to contain the electromagnetic signals proximate to the at least one sub-system component. A waveguide is operable to route a portion of the electromagnetic signals through a waveguide transmitter interface, a waveguide medium, and a waveguide transition interface to the at least one of the sensing/control/identification devices. A remote processing unit is operable to communicate with the network of the
(Continued)

sensing/control/identification devices through the electromagnetic signals.

20 Claims, 5 Drawing Sheets

Related U.S. Application Data (60) Provisional application No. 61/946,064, filed on Feb. 28, 2014.

(51) Int. Cl.
    *H04Q 9/00*     (2006.01)
    *H01Q 5/55*     (2015.01)
    *F01D 21/00*     (2006.01)
    *H04L 12/24*     (2006.01)
    *H04Q 1/28*     (2006.01)
    *F02K 3/06*     (2006.01)
    *G07C 5/00*     (2006.01)
    *H04B 15/02*     (2006.01)
    *H04W 12/04*     (2009.01)
    *G01M 15/14*     (2006.01)
    *H04B 1/02*     (2006.01)
    *F02C 3/04*     (2006.01)
    *F02C 9/00*     (2006.01)
    *H01P 3/12*     (2006.01)
    *H01P 5/02*     (2006.01)
    *H05K 9/00*     (2006.01)
    *H04L 12/40*     (2006.01)
    *G06K 7/10*     (2006.01)
    *G07C 5/08*     (2006.01)
    *H04B 1/00*     (2006.01)
    *H04L 29/08*     (2006.01)
    *H04W 84/18*     (2009.01)
    *H04W 84/12*     (2009.01)

(52) U.S. Cl.
    CPC .............. *F02K 3/06* (2013.01); *G01M 15/14* (2013.01); *G06K 7/10188* (2013.01); *G07C 5/008* (2013.01); *G07C 5/0808* (2013.01); *H01P 3/122* (2013.01); *H01P 5/02* (2013.01); *H01Q 5/55* (2015.01); *H04B 1/02* (2013.01); *H04B 15/02* (2013.01); *H04L 12/40045* (2013.01); *H04L 41/0803* (2013.01); *H04Q 1/28* (2013.01); *H04Q 9/00* (2013.01); *H04W 12/04* (2013.01); *H05K 9/0081* (2013.01); *F05D 2220/32* (2013.01); *F05D 2220/323* (2013.01); *F05D 2260/80* (2013.01); *F05D 2270/54* (2013.01); *F05D 2270/80* (2013.01); *H04L 67/10* (2013.01); *H04L 67/12* (2013.01); *H04L 2012/40273* (2013.01); *H04Q 2209/40* (2013.01); *H04W 84/12* (2013.01); *H04W 84/18* (2013.01)

(58) Field of Classification Search
    USPC ...................................... 455/67.12, 300, 301
    See application file for complete search history.

(56) References Cited

U.S. PATENT DOCUMENTS

| | | | |
|---|---|---|---|
| 9,685,299 B2 | 6/2017 | Nakagawa | |
| 2005/0040934 A1* | 2/2005 | Shanton | A47F 5/11 340/5.92 |
| 2006/0270354 A1 | 11/2006 | De La Chapelle et al. | |
| 2007/0108770 A1 | 5/2007 | Riesberg | |
| 2007/0199989 A1 | 8/2007 | Piety et al. | |
| 2008/0055047 A1 | 3/2008 | Osada et al. | |
| 2010/0049377 A1* | 2/2010 | Scheid | F01D 17/02 701/3 |
| 2010/0219942 A1 | 9/2010 | Lee | |
| 2010/0231407 A1 | 9/2010 | Carr | |
| 2011/0300809 A1 | 12/2011 | Gordiyenko et al. | |
| 2011/0309937 A1 | 12/2011 | Bunza et al. | |
| 2012/0121383 A1 | 5/2012 | Michligk | |
| 2013/0306737 A1 | 11/2013 | Freeman | |
| 2013/0335197 A1 | 12/2013 | Oder et al. | |
| 2014/0052410 A1 | 2/2014 | Tralshawala et al. | |
| 2015/0022373 A1 | 1/2015 | Bommer et al. | |
| 2016/0118703 A1 | 4/2016 | Hejase et al. | |
| 2016/0209264 A1 | 7/2016 | Berkcan et al. | |
| 2016/0314631 A1 | 10/2016 | Sobanski | |
| 2016/0369650 A1 | 12/2016 | Sobanski et al. | |
| 2016/0369651 A1 | 12/2016 | Sobanski et al. | |
| 2016/0370256 A1 | 12/2016 | Zacchio | |
| 2016/0371896 A1 | 12/2016 | Mantese et al. | |
| 2016/0371897 A1 | 12/2016 | Mantese et al. | |
| 2016/0373836 A1 | 12/2016 | Sobanski et al. | |
| 2016/0373837 A1 | 12/2016 | Sobanski et al. | |
| 2016/0373838 A1 | 12/2016 | Mantese et al. | |
| 2017/0238070 A1 | 8/2017 | Mantese et al. | |

FOREIGN PATENT DOCUMENTS

| | | | |
|---|---|---|---|
| EP | 2927648 A1 | 10/2007 | |
| EP | 2154552 A1 | 2/2010 | |
| EP | 2728818 A1 | 5/2014 | |
| EP | 2913808 | 9/2015 | |
| EP | 2961087 | 12/2015 | |
| GB | 886127 | 1/1962 | |
| WO | 0079369 | 12/2000 | |
| WO | 0116554 A2 | 3/2001 | |
| WO | 2005096571 A1 | 10/2005 | |
| WO | WO 2005096571 | 10/2005 | |
| WO | 2014094982 A1 | 6/2014 | |
| WO | 2014121338 A1 | 8/2014 | |
| WO | 2014121402 A1 | 8/2014 | |
| WO | 2015073852 A1 | 5/2015 | |
| WO | 2015130563 | 9/2015 | |
| WO | 2016034773 A1 | 3/2016 | |

OTHER PUBLICATIONS

EP Applicaton No. 17188885.2 EP Search Report dated Jan. 18, 2018, 9 pages.
European Search Report for European Application No. 1718238.3 dated Feb. 16, 2018, 41 pages.
European Search Report for European Patent Application No. 17188894.4 dated Jan. 18, 2018, 8 pages.
EP App. No. 17188888.6 Search Report; dated Feb. 1, 2018; 11 pgs.
EP Application No. 15754972.6 Extended European Search Report dated Nov. 10, 2017, 8 pages.
European Search Report for European Application No. 17189199.7 dated Jan. 5, 2018, 8 pages.
European Search Report for European Patent Application No. 17189173.2 dated Jan. 19, 2018, 10 pages.
European Search Report, European Application No. 17188875.3, dated Jan. 30, 2018, European Patent Office; European Search Report 5 pages.
European Search Report, European Application No. 17188883.7, dated Jan. 23, 2018, European Patent Office; European Search Report 8 pages.
Extended European Search Report, EP Application No. 17189235.9, dated Jan. 19, 2018, 21 pages.
International Application No. PCT/US2015/016761 International Search Report and Written Opinion dated May 28, 2015, 12 pages.
Lee J W, et al., "A Technique to build a secret key in integrated circuits for identification and authentication applications", Symposium on VLSI Circuits Digest of Technical Papers, Jun. 17, 2004, pp. 176-179, XP-002420397.
Ranasinghe D C et al., "Security and Privacy Solutions for Low-Cost RFID Systems", ISSNIP-IEEE, Dec. 14, 2004, pp. 337-342, DOI 10.1109/ISSNIP.2004.1417485.

(56) References Cited

OTHER PUBLICATIONS

Strunk, et al. "The Elements of Style", 3rd Edition, 1979; 3 pages.

* cited by examiner

ELECTROMAGNETIC COMMUNICATION FROM WAVEGUIDE CONFINEMENT

CROSS REFERENCE TO RELATED APPLICATIONS

This Application is a continuation-in-part of U.S. patent application Ser. No. 15/114,234 filed on Jul. 26, 2016, which is a U.S. National Stage of Application No. PCT/US2015/016761 filed on Feb. 20, 2015, which claims the benefit of U.S. Provisional Patent Application No. 61/946,064 filed on Feb. 28, 2014, the contents of each of these applications are incorporated herein by reference thereto.

BACKGROUND

This disclosure relates to electromagnetic communication, and more particularly to electromagnetic communication from waveguide confinement.

A gas turbine engine typically includes a fan section, a compressor section, a combustor section and a turbine section. Air entering the compressor section is compressed and delivered into the combustor section where it is mixed with fuel and ignited to generate a high-speed exhaust gas flow. The high-speed exhaust gas flow expands through the turbine section to drive the compressor and the fan section. The compressor section typically includes low and high pressure compressors, and the turbine section includes low and high pressure turbines.

Detailed knowledge of gas turbine engine and other machinery operation for control or health monitoring requires sensing systems that need information from locations that are sometimes difficult to access due to moving parts, internal operating environment or machine configuration. The access limitations make wire routing bulky, expensive and vulnerable to interconnect failures. The sensor and interconnect operating environments for desired sensor locations often exceed the capability of the interconnect systems. In some cases, cable cost, volume and weight exceed the desired limits for practical applications.

Application of electromagnetic sensor technologies to address the wiring constraints faces the challenge of providing reliable communications in a potentially unknown environment with potential interference from internal or external sources.

BRIEF DESCRIPTION

In an embodiment, a system of a machine includes a network of a plurality of sensing/control/identification devices distributed throughout the machine. Each of the sensing/control/identification devices is associated with at least one sub-system component of the machine and operable to communicate through a plurality of electromagnetic signals. Shielding surrounds at least one of the sensing/control/identification devices to contain the electromagnetic signals proximate to the at least one sub-system component. A waveguide is operable to route a portion of the electromagnetic signals through a waveguide transmitter interface, a waveguide medium, and a waveguide transition interface to the at least one of the sensing/control/identification devices. A remote processing unit is operable to communicate with the network of the sensing/control/identification devices through the electromagnetic signals.

In addition to one or more of the features described above, or as an alternative to any of the foregoing embodiments, further embodiments may include where the waveguide is operable to transmit the portion of the electromagnetic signals from confinement of the waveguide to an enclosed free space within the shielding.

In addition to one or more of the features described above, or as an alternative to any of the foregoing embodiments, further embodiments may include where the waveguide includes a first portion between the waveguide transmitter interface and the waveguide transition interface.

In addition to one or more of the features described above, or as an alternative to any of the foregoing embodiments, further embodiments may include where the waveguide further includes a second portion between the waveguide transition interface and a secondary waveguide transition interface.

In addition to one or more of the features described above, or as an alternative to any of the foregoing embodiments, further embodiments may include where the second portion includes a second waveguide medium that is different from the waveguide medium of the first portion.

In addition to one or more of the features described above, or as an alternative to any of the foregoing embodiments, further embodiments may include where the waveguide transmitter interface is in a first environment and the secondary waveguide transition interface is in a second environment having one or more of a different temperature and a different pressure than the first environment.

In addition to one or more of the features described above, or as an alternative to any of the foregoing embodiments, further embodiments may include where the waveguide transition interface includes a transition window operable to pass a frequency range of interest between the first portion and the second portion of the waveguide.

According to an embodiment, a system for a gas turbine engine includes a network of a plurality of sensing/control/identification devices distributed throughout the gas turbine engine. Each of the sensing/control/identification devices is associated with at least one sub-system component of the gas turbine engine and operable to communicate through a plurality of electromagnetic signals. Shielding surrounds at least one of the sensing/control/identification devices to contain the electromagnetic signals proximate to the at least one sub-system component. A waveguide is operable to route a portion of the electromagnetic signals through a waveguide transmitter interface, a waveguide medium, and a waveguide transition interface to the at least one of the sensing/control/identification devices. A remote processing unit is operable to communicate with the network of the sensing/control/identification devices through the electromagnetic signals.

In addition to one or more of the features described above, or as an alternative to any of the foregoing embodiments, further embodiments may include where the at least one sub-system component is part of at least one of a fan section, a compressor section, a combustor section and a turbine section of the gas turbine engine, and the at least one sub-system component contains a parameter of interest to a control and health monitoring system, where the parameter of interest is one of a pressure, a temperature, a speed, a position, vibration and proximity or any other relevant physically measurable parameter, and further where the waveguide is operable to transmit the portion of the electromagnetic signals from confinement of the waveguide to an enclosed free space within the shielding.

A further embodiment includes a method of establishing electromagnetic communication from waveguide confinement. The method includes configuring a remote processing unit to power and communicate with a network of a plurality of sensing/control/identification devices in the machine using a plurality of electromagnetic signals. A shielded volume associated with at least one sub-system component of the machine is formed, where the shielded volume surrounds at least one of the sensing/control/identification devices to contain the electromagnetic signals proximate to the at least one sub-system component. A portion of the electromagnetic signals is routed to the at least one of the sensing/control/identification devices through a waveguide including a waveguide transmitter interface, a waveguide medium, and a waveguide transition interface. A transmission path is linked between the remote processing unit and the shielded volume.

A technical effect of the apparatus, systems and methods is achieved by electromagnetic communication from waveguide confinement as described herein.

BRIEF DESCRIPTION OF THE DRAWINGS

The subject matter which is regarded as the present disclosure is particularly pointed out and distinctly claimed in the claims at the conclusion of the specification. The foregoing and other features, and advantages of the present disclosure are apparent from the following detailed description taken in conjunction with the accompanying drawings in which:

DETAILED DESCRIPTION

Figure 1:
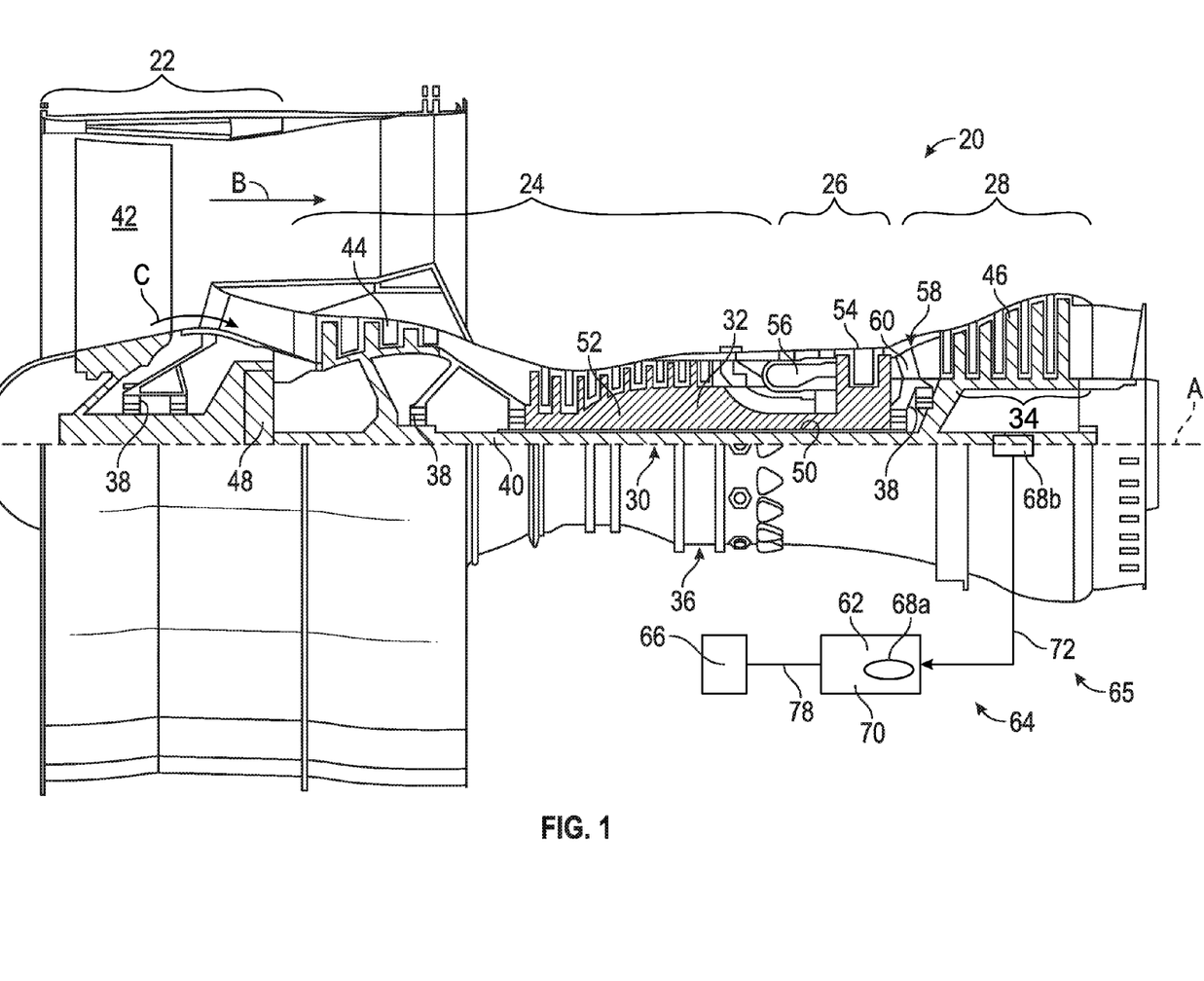
FIG. 1 is a cross-sectional view of a gas turbine engine.

Various embodiments of the present disclosure are related to electromagnetic communication from waveguide confinement. FIG. 1 schematically illustrates a gas turbine engine 20 as one example of a machine as further described herein. The gas turbine engine 20 is depicted as a two-spool turbofan that generally incorporates a fan section 22, a compressor section 24, a combustor section 26 and a turbine section 28. Alternative engines may include an augmentor section (not shown) among other systems or features. The fan section 22 drives air along a bypass flow path B in a bypass duct to provide a majority of the thrust, while the compressor section 24 drives air along a core flow path C for compression and communication into the combustor section 26 then expansion through the turbine section 28. Although depicted as a two-spool turbofan gas turbine engine in the disclosed non-limiting embodiment, it should be understood that the concepts described herein are not limited to use with two-spool turbofans as the teachings may be applied to other types of turbine engines including three-spool architectures or any other machine that requires sensors to operate with similar environmental challenges or constraints. Additionally, the concepts described herein may be applied to any machine or system comprised of control and/or health monitoring systems.

The exemplary engine 20 generally includes a low speed spool 30 and a high speed spool 32 mounted for rotation about an engine central longitudinal axis A relative to an engine static structure 36 via several bearing systems 38. It should be understood that various bearing systems 38 at various locations may alternatively or additionally be provided, and the location of bearing systems 38 may be varied as appropriate to the application.

The low speed spool 30 generally includes an inner shaft 40 that interconnects a fan 42, a first (or low) pressure compressor 44 and a first (or low) pressure turbine 46. The inner shaft 40 is connected to the fan 42 through a speed change mechanism, which in exemplary gas turbine engine 20 is illustrated as a geared architecture 48 to drive the fan 42 at a lower speed than the low speed spool 30. The high speed spool 32 includes an outer shaft 50 that interconnects a second (or high) pressure compressor 52 and a second (or high) pressure turbine 54. A combustor 56 is arranged in exemplary gas turbine engine 20 between the high pressure compressor 52 and the high pressure turbine 54. A mid-turbine frame 58 of the engine static structure 36 is arranged generally between the high pressure turbine 54 and the low pressure turbine 46. The mid-turbine frame 58 further supports bearing systems 38 in the turbine section 28. The inner shaft 40 and the outer shaft 50 are concentric and rotate via bearing systems 38 about the engine central longitudinal axis A which is collinear with their longitudinal axes.

The core airflow is compressed by the low pressure compressor 44 then the high pressure compressor 52, mixed and burned with fuel in the combustor 56, then expanded over the high pressure turbine 54 and low pressure turbine 46. The mid-turbine frame 58 includes airfoils 60 which are in the core airflow path C. The turbines 46, 54 rotationally drive the respective low speed spool 30 and high speed spool 32 in response to the expansion. It will be appreciated that each of the positions of the fan section 22, compressor section 24, combustor section 26, turbine section 28, and fan drive gear system 48 may be varied. For example, gear system 48 may be located aft of combustor section 26 or even aft of turbine section 28, and fan section 22 may be positioned forward or aft of the location of gear system 48.

The engine 20 in one example is a high-bypass geared aircraft engine. In a further example, the engine 20 bypass ratio is greater than about six (6), with an example embodiment being greater than about ten (10), the geared architecture 48 is an epicyclic gear train, such as a planetary gear system or other gear system, with a gear reduction ratio of greater than about 2.3 and the low pressure turbine 46 has a pressure ratio that is greater than about five. In one disclosed embodiment, the engine 20 bypass ratio is greater than about ten (10:1), the fan diameter is significantly larger than that of the low pressure compressor 44, and the low pressure turbine 46 has a pressure ratio that is greater than about five 5:1. Low pressure turbine 46 pressure ratio is pressure measured prior to inlet of low pressure turbine 46 as related to the pressure at the outlet of the low pressure turbine 46 prior to an exhaust nozzle. The geared architecture 48 may be an epicycle gear train, such as a planetary gear system or other gear system, with a gear reduction ratio of greater than about 2.3:1. It should be understood, however, that the above parameters are only exemplary of one embodiment of a geared architecture engine and that the present invention is applicable to other gas turbine engines including direct drive turbofans.

A significant amount of thrust is provided by the bypass flow B due to the high bypass ratio. The fan section 22 of the engine 20 is designed for a particular flight condition— typically cruise at about 0.8 Mach and about 35,000 feet (10.67 km). The flight condition of 0.8 Mach and 35,000 ft (10.67 km), with the engine at its best fuel consumption—also known as "bucket cruise Thrust Specific Fuel Consumption ('TSFC')"—is the industry standard parameter of lbm of fuel being burned divided by lbf of thrust the engine produces at that minimum point. "Low fan pressure ratio" is the pressure ratio across the fan blade alone, without a Fan Exit Guide Vane ("FEGV") system. The low fan pressure ratio as disclosed herein according to one non-limiting embodiment is less than about 1.45. "Low corrected fan tip speed" is the actual fan tip speed in ft/sec divided by an industry standard temperature correction of [(Tram° R)/(518.7° R)]0.5. The "Low corrected fan tip speed" as disclosed herein according to one non-limiting embodiment is less than about 1150 ft/second (350 m/second).

The example gas turbine engine includes the fan 42 that comprises in one non-limiting embodiment less than about twenty-six (26) fan blades. In another non-limiting embodiment, the fan section 22 includes less than about twenty (20) fan blades. Moreover, in one disclosed embodiment the low pressure turbine 46 includes no more than about six (6) turbine rotors schematically indicated at 34. In another non-limiting example embodiment the low pressure turbine 46 includes about three (3) turbine rotors. A ratio between the number of fan blades 42 and the number of low pressure turbine rotors is between about 3.3 and about 8.6. The example low pressure turbine 46 provides the driving power to rotate the fan section 22 and therefore the relationship between the number of turbine rotors 34 in the low pressure turbine 46 and the number of blades 42 in the fan section 22 disclose an example gas turbine engine 20 with increased power transfer efficiency.

Figure 2:
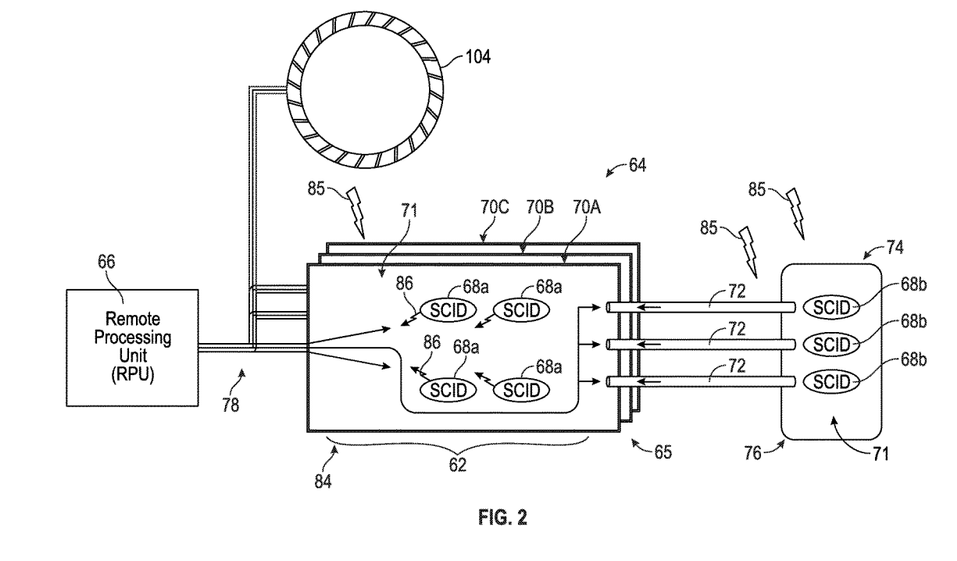
FIG. 2 is a schematic view of an example control and health monitoring system including a shielded electromagnetic network in accordance with an embodiment of the disclosure.

The disclosed example gas turbine engine 20 includes a control and health monitoring system 64 (generally referred to as system 64) utilized to monitor component performance and function. In this example, a sensing/control/identification device (SCID) 68A is located within a sub-system component (SSC) 70. The SCID 68A communicates with electromagnetic energy to a remote processing unit (RPU) 66 through a path comprised of a transmission path 78 and a path 62 within a SSC 70 as best seen in FIG. 2. The path may also be extended along one or more shielded paths 72 to remote SCIDs 68B in separate SSCs 74 (FIG. 2). This entire path (e.g., transmission path 78, path 62, and shielded paths 72) comprises a shielded electromagnetic network (SEN) 65. The RPU 66 may transmit signals to a network 71 of the SCID 68A, 68B (FIG. 2) and/or receive information indicative of current operation of the component being monitored. The transmission media for any portion of the SEN 65 may include solid, liquid or gaseous material. In this example, a pressure internal to the SSC 70 is monitored and that information transmitted through the path 62 of the SEN 65 to the RPU 66 for use in controlling engine operation or monitoring component health. However, it should be understood that it is within the contemplation of this disclosure that the disclosed system 64 may be utilized to control and/or monitor any component function or characteristic of a turbomachine or aircraft component operation and/or other machines.

Prior control & diagnostic system architectures utilized in various applications include centralized system architecture in which the processing functions reside in an electronic control module. Redundancy to accommodate failures and continue system operation systems are provided with dual channels with functionality replicated in both control channels. Actuator and sensor communication is accomplished through analog wiring for power, command, position feedback, sensor excitation and sensor signals. Cables and connections include shielding to minimize effects caused by electromagnetic interference (EMI). The use of analog wiring and the required connections limits application and capability of such systems due to the ability to locate wires, connectors and electronics in small and harsh environments that experience extremes in temperature, pressure, and/or vibration.

Referring to FIG. 2, system 64 includes SEN 65 installed near, in, or on each of several SSCs 70A-C, as examples of the SSC 70 of FIG. 1. Each of the SSCs 70A-C may be an engine component, actuator or any other machine part from which information and communication is performed for monitoring and/or control purposes. In this example, each of the SSCs 70A-C includes a path 62 of the SEN 65 that is the primary means of communicating with one or multiple features of the particular SSC 70A-C or remotely located SSCs 74. The remotely located SSCs 74 may contain a single or multiple electronic circuits or sensors configured to communicate over the SEN 65.

The RPU 66 sends and receives power and data to and from the SSCs 70A-C and may also provide a communication link between different SSCs 70A-C. The RPU 66 may be located on equipment near other system components or located remotely as desired to meet application requirements.

A transmission path (TP) 78 between the RPU 66 and SSCs 70A-C is used to send and receive data routed through the RPU 66 from a control module or other components. The TP 78 may utilize electrical wire, optic fiber, waveguide or any other electromagnetic communication including radio frequency/microwave electromagnetic energy, visible or non-visible light. The interface between the TP 78 and SSC 70A-C transmits power and signals received through the TP 78 to one or multiple SCIDs 68A in the example SSC 70A.

The example SCIDs 68A, 68B may be radio-frequency identification (RFID) devices that include processing, memory and/or the ability to connect to conventional sensors or effectors such as solenoids or electro-hydraulic servo valves. The SSC 70A may contain radio frequency (R/F) antennas, magnetic devices or optic paths designed to be powered and/or communicate to from the TP 78 paths. The SSCs 70A-C may also use shielded paths 72 that can be configured as any type of electromagnetic communication, including, for instance, a radio frequency, microwaves, magnetic or optic waveguide transmission to the SCIDs 68B located within the remotely located SSCs 74.

Shielding 84 within and around the SSC 70A is provided such that electromagnetic energy or light interference 85 with electromagnetic signals 86 (shown schematically as arrows) within the SSC 70A are mitigated. Moreover, the shielding 84 provides that the signals 86 are less likely to propagate into the environment outside the SSC 70A and enable unauthorized access to information. Similarly, remotely located SSCs 74 can each include respective shielding 76 to limit signal propagation away from or into SSCs 74. In some embodiments, confined electromagnetic radiation is in the range 1-100 GHz. Electromagnetic radiation can be more tightly confined around specific carrier frequencies, such as 3-4.5 GHz, 24 GHz, 60 GHz, or 76-77 GHz as examples in the microwave spectrum. A carrier frequency can transmit electric power, as well as communicate information, to multiple SCIDs 68A, 68B using various modulation and signaling techniques.

RFID, electromagnetic or optical devices implemented as the SCIDs 68A, 68B can provide information indicative of a physical parameter, such as pressure, temperature, speed, proximity, vibration, identification, and/or other parameters used for identifying, monitoring or controlling component operation. The SCIDs 68A, 68B may also include control devices such as a solenoid, switch or other physical actuation devices. Signals communicated over the TP 78 may employ techniques such as checksums, hash algorithms, shielding and/or encryption to mitigate cyber security threats and interference.

The disclosed system 64 containing the SEN 65 (e.g., transmission path 78, path 62, and shielded paths 72) provides a communication link between the RPU 66 and multiple SSCs 70A-C, 74. The shielding 84, 76 can be provided along the transmission path 78 and for each SSC 70A-C and 74 such that power and communication signals are shielded from outside interference, which may be caused by environmental electromagnetic or optic interference. Moreover, the shielding 84, 76 prevents intentional interference 85 with communication at each component. Intentional interference 85 may take the form of unauthorized data capture, data insertion, general disruption and/or any other action that degrades system communication. Environmental sources of interference 85 may originate from noise generated from proximate electrical systems in other components or machinery along with electrostatic fields, and/or any broadcast signals from transmitters or receivers. Additionally, pure environmental phenomena, such as cosmic radio frequency radiation, lightning or other atmospheric effects, could interfere with local electromagnetic communications. Accordingly, the individualized shielding 84, 76 for each of the SSCs 70A-C and 74 prevent the undesired interference with communication. The shielding 84, 76 may be applied to enclosed or semi-enclosed volumes that contain the SCIDs 68.

It should be appreciated that while the system 64 is explained by way of example with regard to a gas turbine engine 20, other machines and machine designs can be modified to incorporate built-in shielding for each monitored or controlled components to enable the use of a SEN. For example, the system 64 can be incorporated in a variety of harsh environment machines, such as an elevator system, heating, ventilation, and air conditioning (HVAC) systems, manufacturing and processing equipment, a vehicle system, an environmental control system, and all the like. The disclosed system 64 includes the SEN 65 that enables consistent communication with electromagnetic devices, such as the example SCIDs 68A, 68B, and removes variables encountered with electromagnetic communications such as distance between transmitters and receiving devices, physical geometry in the field of transmission, control over transmission media such as air or fluids, control over air or fluid contamination through the use of filtering or isolation and knowledge of temperature and pressure.

The system 64 provides for localized transmission to SCIDs 68A, 68B such that power requirements are reduced. Localized transmission occurs within a shielded volume of each SSC 70A-C, 74 that is designed specifically to accommodate reliable electromagnetic transmission for the application specific environment and configuration. Shielding of localized components is provided such that electromagnetic signals are contained within the shielding 84 for a specific instance of the SSC 70A-C. The system 64 therefore enables communication with one or multiple SCIDs 68 simultaneously. The example RPU 66 enables sending and receiving of power and data between several different SSCs 70A-C and 74. The RPU 66 may be located on the equipment near other system components or located away from the machinery for any number of reasons.

The system 64 provides for a reduction in cable and interconnecting systems to reduce cost and increases reliability by reducing the number of physical interconnections. Reductions in cable and connecting systems further provides for a reduction in weight while enabling additional redundancy without significantly increasing cost. Moreover, additional sensors can be added without the need for additional wiring and connections that provide for increased system accuracy and response. Finally, the embodiments enable a "plug-n-play" approach to add a new SCID, potentially without a requalification of the entire system but only the new component; thereby greatly reducing qualification costs and time.

The TP 78 between the RPU 66 and the SSCs 70A-C utilized to send and receive data from other components may take multiple forms such as electrical wire, optic fiber, radio frequency signals or energy within the visible or non-visible light spectrum. The numerous options for a communication path of the TP 78 enable additional design flexibility. The TP 78 transfers energy from the TP 78 to the SSC 70A-C such that one or multiple SCIDs 68A, 68B can be multiplexed over one TP 78 to the RPU 66.

SCIDs 68A, 68B can include RFID devices that may or may not include processing, memory and/or the ability to connect to conventional sensors. Radio frequency (R/F) antennas, magnetic devices or optic paths within the SSCs 70A-C may be designed to communicate with one or multiple SCIDs 68A, 68B. Moreover, R/F, microwave, magnetic or optic waveguide transmission paths 72 can be utilized to communicate with individual electromagnetic devices remotely located from the SSC 70A-C.

Shielding 84, 76 within and around the SSC 70A-C, 74 substantially prevents electromagnetic energy or light interference with signals and also makes it less likely that signals can propagate into the surrounding environment to prevent unauthorized access to information.

According to embodiments, electromagnetic (EM) communication with the system 64 can be performed through multi-material and functional/structural components including, for instance, fuel, oil, engineered dielectrics and enclosed free spaces. By forming waveguides through existing machine components and using electromagnetic communication for one or more of the TP 78, path 62, and/or shielded paths 72, system contaminants and waveguide size for given frequencies can be reduced.

In embodiments, existing components of the gas turbine engine 20 of FIG. 1 can be used to act as waveguides filled with air, fluids or a specifically implemented dielectric to transmit EM energy for writing and reading to/from EM devices in a Faraday cage protected environment. Use of existing structure can allow waveguide channels to be built in at the time of manufacture by machining passages or additively manufacturing waveguide channels as communication paths. For example, communication paths can be built into the structure of SSCs 70A-C and 74 to guide EM energy through each component. The SSCs 70A-C and 74 may contain gas such as air at atmospheric pressure or any other level, or liquids such as oil or fuel. In any part of the system 64, a dielectric may be employed to resist contamination or to reduce requirements for waveguide dimensions.

Figure 3:
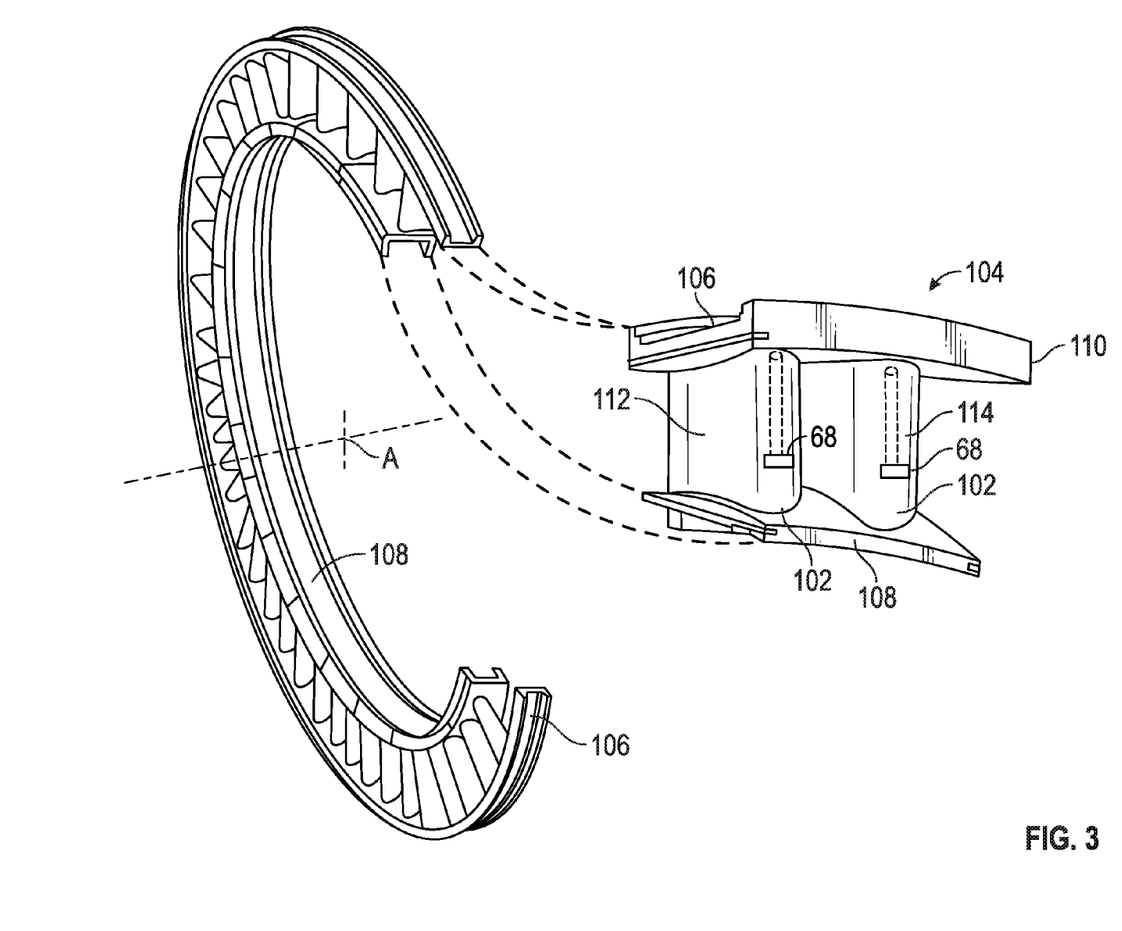
FIG. 3 is a schematic view of a communication path through a component in accordance with an embodiment of the disclosure.

Various machine components may also be used for transmission if the proper waveguide geometry is designed into the component, which can also provide functional and structural aspects of the machine. Examples, such as machine housings, fluid (including air) fill tubes, hydraulic lines, support frames and members, internal machine parts and moving parts that can be coupled to or shaped into waveguide geometry may also be incorporated in embodiments. As one example, FIGS. 2 and FIG. 3 depict a plurality of compressor vane segments 104 of the compressor section 24 of FIG. 1 that incorporate one or more communication paths 102 integrally formed in/on a component of the gas turbine engine 20 of FIG. 1. Each communication path 102 can route a portion of electromagnetic signals communicated from the TP 78 to one or more of the SCIDs 68 of FIG. 3. Each communication path 102 also provides a potentially alternate route in which the electromagnetic signal can be channeled in the event of a line or linkage failure, thereby building in inherent redundancy and system level robustness.

In the example of FIG. 3, a compressor vane segment 104 includes an arcuate outer vane platform segment 106 and an arcuate inner vane platform segment 108 radially spaced apart from each other. The arcuate outer vane platform segment 106 may form an outer portion and the arcuate inner vane platform segment 108 may form an inner portion to at least partially define an annular compressor vane flow path.

Communication path 102 in a vane 112 can be formed during a manufacturing process to directly carry electromagnetic signaling of the TP 78 through a component of the gas turbine engine 20 of FIG. 1 directly to a SCID 68 depicted in FIG. 3. Communication path 102 can also terminate with SCIDs 68 to read pressures, temperatures or other parameters at the end of the TP 78 or 72.

Waveguide usage can enable very low transmission losses such that the RPU 66 of FIG. 2 can be physically located much further away from the SCIDs 68A, 68B of FIG. 2 than conventional free space transmitting devices. Use of a dielectric in the waveguides can reduce the dimensional requirements for the waveguides and resist contaminants, such as moisture, particles, gases, corrosion, and/or liquids that may increase transmission losses. Embodiments can use fluids in existing systems to act as a dielectric, particularly fluids with a dielectric constant that approaches or is better than free space. Thus, existing fuel or oil lines of the gas turbine engine 20 of FIG. 1 may be used as waveguides if they have appropriate dielectric properties.

Figure 4:
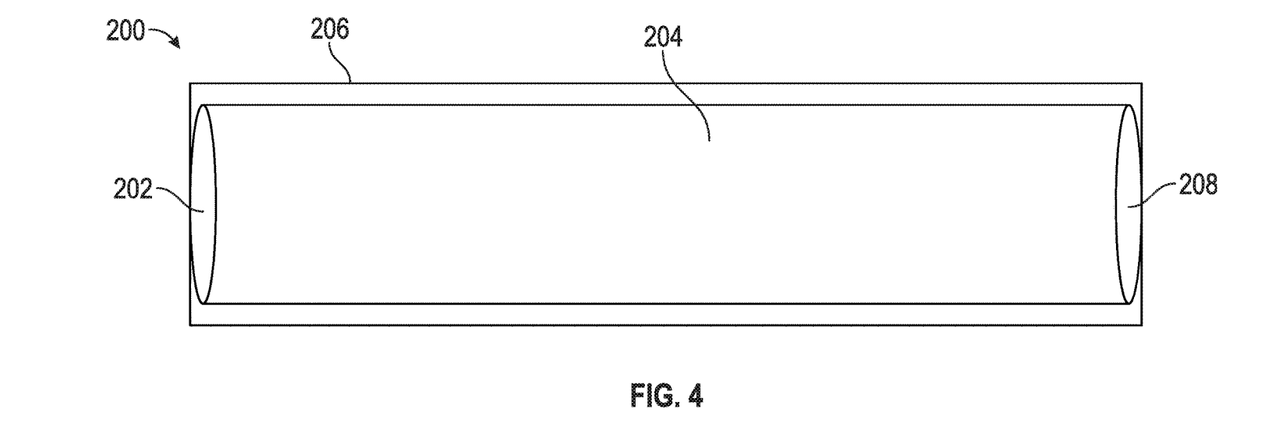
FIG. 4 is a schematic view of a waveguide in accordance with an embodiment of the disclosure.

Further embodiments include allowing transition of EM energy from a waveguide into a free space environment. Some of the SSCs 70A-C, 74 of FIG. 2 have multiple SCIDs 68A, 68B that reside in a protected Faraday cage (e.g., a shielded volume within shielding 84, 76) filled with air or other fluids. Transitioning energy from a waveguide to and from an open cavity is required to prevent unwanted signal loss. Embodiments transition EM energy from TP 78 into a free space environment containing either air or a fluid within shielding 84 of SSC 70A of FIG. 2 using an example waveguide 200 of FIG. 4. The waveguide 200 may be an embodiment of the TP 78 or the shielded path 72 of FIG. 2. In some embodiments, EM energy transitions through multiple interfaces having different environmental characteristics, such as waveguide 250 of FIG. 5 as a further example of the shielded path 72 of FIG. 2. Waveguides 200, 250 can connect multiple SCIDs 68 and may pass through existing components, for instance, in communication path 102 of FIG. 3, to facilitate transmission of EM power and signaling between devices. The waveguides 200, 250 may incorporate "T"s, "Y"s, splitters or other branching types to facilitate a network topology.

EM energy may be confined to a waveguide, or alternatively can be transmitted through a combination of waveguide and free space communications in a shielded environment, e.g., within shielding 84, 76 of FIG. 2, to meet system requirements for signal attenuation and disturbances. Waveguide 200 of FIG. 4 can include a waveguide transmitter interface 202 that enables electromagnetic signal transmission within a waveguide medium or electromagnetic window 204 in a guidance structure 206 to a waveguide transition interface 208. The waveguide transmitter interface 202 may be an EM energy emitter, and the waveguide transition interface 208 may be operable to pass the EM energy through shaping, an antenna structure, or an active structure to a confined free space within shielding 84, 76 of FIG. 2. The waveguide medium 204 can be a gas or liquid, such as air, oil, fuel, solid dielectric, or the like. In some embodiments, the waveguide medium 204 is a dielectric. The guidance structure 206 can be a metal tube and may be integrally formed on/within a component of the gas turbine engine 20 of FIG. 1, such as communication path 102 of FIG. 3. In other embodiments, the guidance structure 206 is an outer edge of a dielectric and need not include a metallic structure. Although depicted as a single straight path, it will be understood that the waveguide 200 can bend and branch to reach multiple SCIDs 68A, 68B of FIG. 2. In other embodiments, the waveguide 200 may take the form of a planer stripline, or trace on a printed circuit board.

Figure 5:
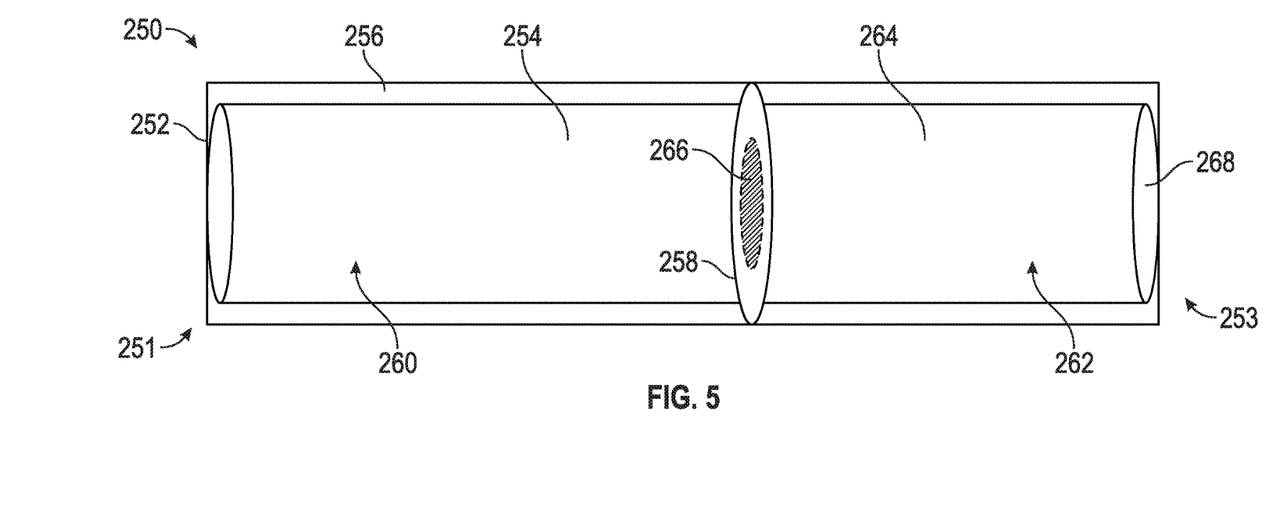
FIG. 5 is a schematic view of another waveguide in accordance with an embodiment of the disclosure.

Transitioning EM energy from a waveguide to and from cavities using TP 78 and/or shielded paths 72 can present a challenge when SCIDs 68A, 68B of FIG. 2 are located in higher temperature or pressure environments, especially in environments containing fuel, oil, flammable liquids or the associate vapors. With further reference to FIG. 5, the waveguide 250 enables transitioning of EM energy from a first environment 251 into a second environment 253 with a higher temperature and/or higher pressure capable barrier against fluids or gasses. Waveguide 250 of FIG. 5 can include a waveguide transmitter interface 252 that enables electromagnetic signal transmission within a guidance structure 256 to a waveguide transition interface 258. The waveguide transmitter interface 252 may be an EM energy emitter in the first environment 251. The waveguide transition interface 258 may be operable to pass the EM energy through shaping, an antenna structure, or an active structure from a first portion 260 of the waveguide 250 to a second portion 262 of the waveguide 250. The first portion 260 of the waveguide 250 may have a first waveguide medium 254 that is different from a second waveguide medium 264 of the second portion 262. A transition window 266 can be incorporated in the waveguide transition interface 258 as a dielectric or thin metal EM window operable to pass a frequency range of interest between the first portion 260 and the second portion 262 of the waveguide 250. The second portion 262 of the waveguide 250 can also include a secondary waveguide transition interface 268 in the second environment 253. The secondary waveguide transition interface 268 can act as a seal to prevent different temperatures and/or pressures of the second environment 253 from directly contacting the first portion 260 of the waveguide 250. The first waveguide medium 254 and the second waveguide medium 264 can be different gasses or liquids, such as air, oil, fuel, or the like and may have different nominal pressures and/or temperatures. In some embodiments, the first waveguide medium 254 and/or the second waveguide medium 264 is a dielectric. The guidance structure 256 can be a metal tube and may be integrally formed on/within a component of the gas turbine engine 20 of FIG. 1, such as communication path 102 of FIG. 3. The guidance structure may also contain more than one waveguide transition interface 258 with a corresponding transition window 266 for redundancy purposes. Although depicted as a single straight path, it will be understood that the waveguide 250 can bend, T, and branch to reach multiple SCIDs 68A, 68B of FIG. 2.

Figure 6:
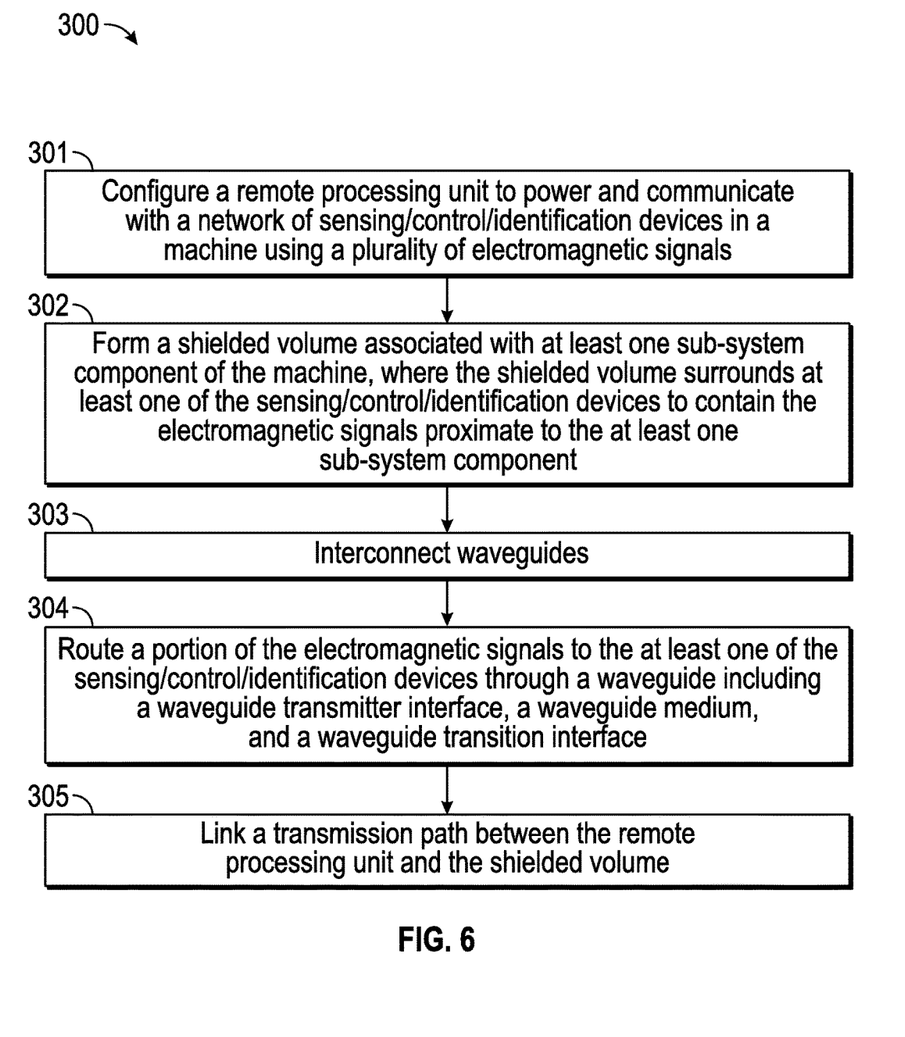
FIG. 6 is a flow chart illustrating a method in accordance with an embodiment of the disclosure.

FIG. 6 is a flow chart illustrating a method 300 for establishing electromagnetic communication from waveguide confinement, such as the gas turbine engine 10 of FIG. 1 in accordance with an embodiment. The method 300 of FIG. 6 is described in reference to FIGS. 1-5 and may be performed with an alternate order and include additional steps.

At block 301, a remote processing unit, such as RPU 66, is configured to power and communicate with the network 71 of SCIDs 68A, 68B in the system 64 using a plurality of electromagnetic signals. Ultimately, multiple SCIDs 68A, 68B would be used in a complete system to take advantage of the architecture scalability.

At block 302, a shielded volume associated with at least one sub-system component of a machine is formed, such as shielding 84 of SSC 70A-C and shielding 76 of SSC 74 of the system 64. The shielded volume may surround at least one of the SCIDs 68A, 68B to contain a plurality of electromagnetic signals proximate to the at least one sub-system component, such as SSC 70A-C, 74.

At block 303, waveguides, such as waveguides 200, 250, are interconnected to provide communication and power for all SCIDs 68A, 68B in the system 64.

At block 304, a portion of the electromagnetic signals may be routed from the TP 78 or shielded paths 72 through a waveguide 200, 250 including a waveguide transmitter interface 202, 252, a waveguide medium 204, 254, 264, such as a gas or liquid and a waveguide transition interface 208, 258. The waveguide 200, 250 can be operable to transmit the portion of the electromagnetic signals from confinement of the waveguide 200, 250 to an enclosed free space within the shielded volume, such as within as shielding 84 of SSC 70A-C and shielding 76 of SSC 74 of the system 64. When implemented as waveguide 250 of FIG. 5, the waveguide 250 can include a first portion 260 between the waveguide transmitter interface 252 and the waveguide transition interface 258 and can include a second portion 262 between the waveguide transition interface 258 and a secondary waveguide transition interface 268. The second portion 262 can include a second waveguide medium 264 that is different from the first waveguide medium 254 of the first portion 260. In some embodiments, the first waveguide medium 254 and the second waveguide medium 264 can include a gas, such as air, a liquid, such as fuel or oil, or an engineered dielectric material. The waveguide transmitter interface 252 can be located in a first environment 251, and the secondary waveguide transition interface 268 can be located in a second environment 253 having one or more of a different temperature and a different pressure than the first environment 251. The waveguide transition interface 258 can include a transition window 266 operable to pass a frequency range of interest between the first portion 260 and the second portion 262 of the waveguide 250, where the transition window 266 may be a dielectric or thin metal EM window.

At block 305, a transmission path 78 is linked between the remote processing unit 66 in communication with the shielded volume. The transmission path 78 can include one or more waveguides 200, 250 and be routed through one or more sections of the gas turbine engine 20.

While the present disclosure has been described in detail in connection with only a limited number of embodiments, it should be readily understood that the present disclosure is not limited to such disclosed embodiments. Rather, the present disclosure can be modified to incorporate any number of variations, alterations, substitutions or equivalent arrangements not heretofore described, but which are commensurate with the spirit and scope of the present disclosure. Additionally, while various embodiments of the present disclosure have been described, it is to be understood that aspects of the present disclosure may include only some of the described embodiments. Accordingly, the present disclosure is not to be seen as limited by the foregoing description, but is only limited by the scope of the appended claims.

The invention claimed is:

1. A system of a machine, the system comprising:
    a network of a plurality of sensing/control/identification devices distributed throughout the machine, each of the sensing/control/identification devices associated with at least one sub-system component of the machine and operable to communicate through a plurality of electromagnetic signals;
    shielding surrounding at least one of the sensing/control/identification devices to contain the electromagnetic signals proximate to the at least one sub-system component;
    a waveguide operable to route a portion of the electromagnetic signals through a waveguide transmitter interface, a waveguide medium, and a waveguide transition interface to the at least one of the sensing/control/identification devices; and
    a remote processing unit operable to communicate with the network of the sensing/control/identification devices through the electromagnetic signals.

2. The system as recited in claim 1, wherein the waveguide is operable to transmit the portion of the electromagnetic signals from confinement of the waveguide to an enclosed free space within the shielding.

3. The system as recited in claim 1, wherein the waveguide comprises a first portion between the waveguide transmitter interface and the waveguide transition interface.

4. The system as recited in claim 3, wherein the waveguide further comprises a second portion between the waveguide transition interface and a secondary waveguide transition interface.

5. The system as recited in claim 4, wherein the second portion comprises a second waveguide medium that is different from the waveguide medium of the first portion.

6. The system as recited in claim 4, wherein the waveguide transmitter interface is in a first environment and the secondary waveguide transition interface is in a second environment having one or more of a different temperature and a different pressure than the first environment.

7. The system as recited in claim 4, wherein the waveguide transition interface comprises a transition window operable to pass a frequency range of interest between the first portion and the second portion of the waveguide.

8. A system for a gas turbine engine, the system comprising:
    a network of a plurality of sensing/control/identification devices distributed throughout the gas turbine engine, each of the sensing/control/identification devices associated with at least one sub-system component of the gas turbine engine and operable to communicate through a plurality of electromagnetic signals;
    shielding surrounding at least one of the sensing/control/identification devices to contain the electromagnetic signals proximate to the at least one sub-system component;

a waveguide operable to route a portion of the electromagnetic signals through a waveguide transmitter interface, a waveguide medium, and a waveguide transition interface to the at least one of the sensing/control/identification devices; and a remote processing unit operable to communicate with the network of the sensing/control/identification devices through the electromagnetic signals.

9. The system as recited in claim 8, wherein the at least one sub-system component is part of at least one of a fan section, a compressor section, a combustor section and a turbine section of the gas turbine engine, and the at least one sub-system component contains a parameter of interest to a control and health monitoring system, wherein the parameter of interest is one of a pressure, a temperature, a speed, a position, vibration and proximity or any other relevant physically measurable parameter, and further wherein the waveguide is operable to transmit the portion of the electromagnetic signals from confinement of the waveguide to an enclosed free space within the shielding.

10. The system as recited in claim 8, wherein the waveguide comprises a first portion between the waveguide transmitter interface and the waveguide transition interface, and the waveguide further comprises a second portion between the waveguide transition interface and a secondary waveguide transition interface.

11. The system as recited in claim 10, the second portion comprises a second waveguide medium that is different from the waveguide medium of the first portion.

12. The system as recited in claim 10, wherein the waveguide transmitter interface is in a first environment and the secondary waveguide transition interface is in a second environment having one or more of a different temperature and a different pressure than the first environment.

13. The system as recited in claim 10, wherein the waveguide transition interface comprises a transition window operable to pass a frequency range of interest between the first portion and the second portion of the waveguide.

14. A method of establishing electromagnetic communication from waveguide confinement, the method comprising:

configuring a remote processing unit to power and communicate with a network of a plurality of sensing/control/identification devices in the machine using a plurality of electromagnetic signals;

forming a shielded volume associated with at least one sub-system component of the machine, wherein the shielded volume surrounds at least one of the sensing/control/identification devices to contain the electromagnetic signals proximate to the at least one sub-system component;

routing a portion of the electromagnetic signals to the at least one of the sensing/control/identification devices through a waveguide comprising a waveguide transmitter interface, a waveguide medium, and a waveguide transition interface; and linking a transmission path between the remote processing unit and the shielded volume.

15. The method as recited in claim 14, wherein the waveguide is operable to transmit the portion of the electromagnetic signals from confinement of the waveguide to an enclosed free space within the shielded volume.

16. The method as recited in claim 14, wherein the waveguide comprises a first portion between the waveguide transmitter interface and the waveguide transition interface.

17. The method as recited in claim 16, wherein the waveguide further comprises a second portion between the waveguide transition interface and a secondary waveguide transition interface.

18. The method as recited in claim 17, wherein the second portion comprises a second waveguide medium that is different from the waveguide medium of the first portion.

19. The method as recited in claim 17, wherein the waveguide transmitter interface is in a first environment and the secondary waveguide transition interface is in a second environment having one or more of a different temperature and a different pressure than the first environment.

20. The method as recited in claim 17, wherein the waveguide transition interface comprises a transition window operable to pass a frequency range of interest between the first portion and the second portion of the waveguide.

* * * * *